United States Patent [19]

Maier et al.

[11] 4,441,033

[45] Apr. 3, 1984

[54] PROCESS FOR THE GENERATION OF HIGH CAPACITY PULSES FROM AN INDUCTIVE ENERGY STORAGE DEVICE

[75] Inventors: Franz Maier; Stephan Maier, both of Wettingen, Switzerland

[73] Assignee: BBC Brown, Boveri & Company, Limited, Baden, Switzerland

[21] Appl. No.: 413,353

[22] PCT Filed: Jul. 30, 1981

[86] PCT No.: PCT/CH81/00087

§ 371 Date: Aug. 20, 1982

§ 102(e) Date: Aug. 20, 1982

[87] PCT Pub. No.: WO82/02295

PCT Pub. Date: Jul. 8, 1982

[30] Foreign Application Priority Data

Dec. 22, 1980 [CH] Switzerland .................. 9452/80

[51] Int. Cl.³ ............................................. H03K 3/00
[52] U.S. Cl. .................................. 307/107; 307/108; 363/129
[58] Field of Search .............. 307/104, 106, 107, 108, 307/109; 376/143

[56] References Cited

U.S. PATENT DOCUMENTS

| 3,564,276 | 2/1971 | Eijnsbergen | 307/106 |
| 3,978,346 | 8/1976 | Iwata | 307/82 X |
| 3,984,751 | 10/1976 | Iwata et al. | 307/104 X |

Primary Examiner—E. A. Goldberg
Assistant Examiner—D. Jennings
Attorney, Agent, or Firm—Burns, Doane, Swecker & Mathis

[57] ABSTRACT

An inductive storage circuit for generating high voltage pulses includes a quenching circuit and a discharge circuit each connected in parallel with a storage inductor. One branch of the quenching circuit includes a quenching capacitor and one branch of the discharge circuit includes a resistor and a diode in series. These two branches have a common junction, to which is connected a quenching thyristor that forms the second branch of each of the quenching and discharge circuits. Thus, the quenching thyristor is in series with each of the quenching capacitor and the discharge resistor.

3 Claims, 3 Drawing Figures

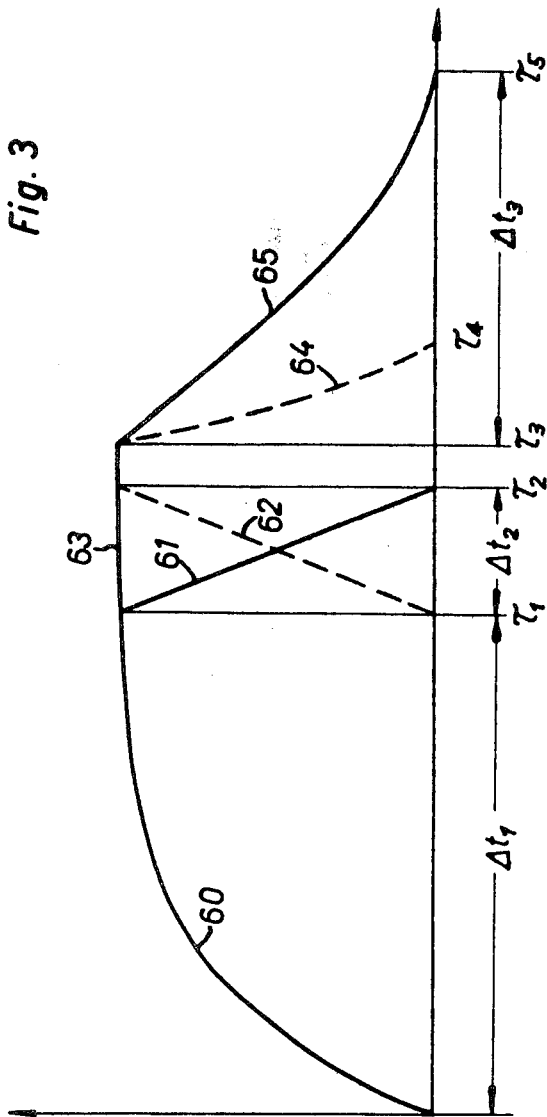

PROCESS FOR THE GENERATION OF HIGH CAPACITY PULSES FROM AN INDUCTIVE ENERGY STORAGE DEVICE

FIELD OF THE INVENTION

The present invention concerns a process for the generation of high capacity pulses from an inductive power storage device, connected for the storage of energy with a source of current, together with an electric circuit for the embodiment of a preferred application of said process.

DESCRIPTION OF THE PRIOR ART

Electric high capacity pulses with capacities within a range of 10 MW to 1 GW are used in highly different fields of technology, for example in the testing of switches and nonlinear resistance arresters, in high velocity processing and in particular in the noncutting deformation of metals, in pulse melting processes and for the generation of shock waves for the comminution of minerals or the disinfection of sewage. A further important application of high capacity pulses is the induction of a current in the plasma ring of an installation for nuclear fusion.

The power for the production of such pulses may be taken directly from a high capacity grid, an electric machine or a suitable storage device. As high capacity grids in general are not designed for pulse loads and therefore are not well suited for the purpose, and since usable electric machines, such as flywheel or three-phase generators, involve a large equipment outlay, the employment of relatively simple capacitive or inductive storage devices is desirable, with inductive storage devices being the more preferred for reasons of the relatively higher energy density in the magnetic field.

For the purpose of producing a high capacity pulse from an inductive storage device, the latter is initially connected with a source of direct current. As soon as a sufficiently strong magnetic field has been built up by the direct current, by means of the commutation of the current to a circuit with a higher resistance, the current in the storage inductor is very steeply reduced, leading to a change in the magnetic flux therein. The magnetic energy corresponding to this change in flux appears as an electric pulse, which is either converted fully into heat in the primary circuit or is coupled out from the circuit by the inductive action of the primary circuit for a certain application.

The known installations for the embodiment of the aforedescribed process contain a switch, having in the closed state a negligible line resistance, together with a line branch parallel to the switch, with a relatively high ohmic resistance. The direct current is commutated into the parallel branch by the opening of the switch and the resistance effects a steep change in the current, again producing a pulse. In order to enable the switch to be opened in the case of direct currents of the order of magnitude of 50 . . . 100 kA, without having an arc flattening the steepness of the change in the current or damaging the switch, a quenching circuit is connected in parallel with the switch, containing a capacitor and a spark gap connected in series with it. The potential at the capacitor is chosen so that upon the ignition of the spark gap and the discharge of the capacitor, the discharge current flowing through the switch is directed against the direct current. If all structural elements are dimensioned correctly and the ignition of the spark gap and the mechanical motion of the switch synchronized adequately, it is possible to open the switch within the period of time in which the direct current and the discharge current in the switch are practically cancelling each other out. A layout of this type and a suitable power switch are described by K. Kriechbaum in the journal "E und M" Vol. 94 (1977), p. 576 ff.

A substantial disadvantage of this process without interruption of the current from the source is that only a portion of the power available in the inductive storage device is released. Further disadvantages are the initiation of the pulse generation by the ignition of the spark gap and its synchronization with the mechanical motion of the switch, for which, in spite of an additional electronic control device, a relatively large tolerance must be allowed. Finally, the known switches used in the embodiment of the process are highly complex devices and therefore prone to failure; they must be connected during the operation to a compressed gas line for the quenching of the incipient arc and the mechanical wear of which permits only a limited number of switching processes.

It is therefore the object of the present invention to provide a process for the generation of high capacity pulses from an inductive storage device, whereby all of the inductively stored energy is utilized, the switching processes whereof are initiated and synchronized securily and which is effected by means of switching elements containing no mechanically moving elements subject to wear.

STATEMENT OF THE INVENTION

According to the invention, this object is attained by means of a process of the abovementioned type, characterized in that the stored current is interrupted and the power storage device is short ciruited through a discharge circuit.

In the process according to the invention, by means of the interruption of the storage feeder current all of the stored power is released, which with an identical outlay for the storage device, makes it possible to generate pulses of a higher power than feasible heretofore. Furthermore, by the dimensioning of the discharge circuit, the progress in time of the discharge and thus the shape of the pulse may be adapted to the application intended.

A preferred electronic circuit for the embodiment of the process of the invention contains an inductive storage device, connected through a thyristor with a source of current, together with a quenching circuit with a quenching thyristor and a capacitor connected in series with it, and a discharge circuit connected parallel to the inductive storage device, and is characterized in that said discharge circuit and the quenching circuit have a common branch of the current and that the quenching thyristor is used simultaneously as a controlled resistance arrester for the discharge circuit and that the remaining current branch of the discharge circuit possesses a diode poled in series with the quenching thyristor.

This circuit contains semiconductor circuit elements experiencing practically no wear, thereby making possible an unlimited number of switching actions. A further advantage of the circuit is that the synchronization of the actuating pulse for the quenching thyristor and the suppression of the actuating signal for the switching thyristor may be effected without a special technical outlay, with a high accuracy.

A preferred application of the novel process is the generation of high capacity pulses for the induction of a toroidal current in the plasma of a nuclear fusion installation.

BRIEF DESCRIPTION OF THE DRAWINGS

The process according to the invention shall be described hereinafter with the aid of the figures, with reference to two forms of embodiment of the preferred electronic circuit for the embodiment of the process. In the drawing:

FIG. 3 shows the variation of the current in the primary circuit of storage inductor and in the switching thyristor and the quenching capacitor.

DESCRIPTION OF PREFERRED EMBODIMENTS

In the description hereinafter and in the abovementioned figures the control circuits for the thyristors, well known to those skilled in the art, are neither described nor shown, to simplify the description.

Figure 1:
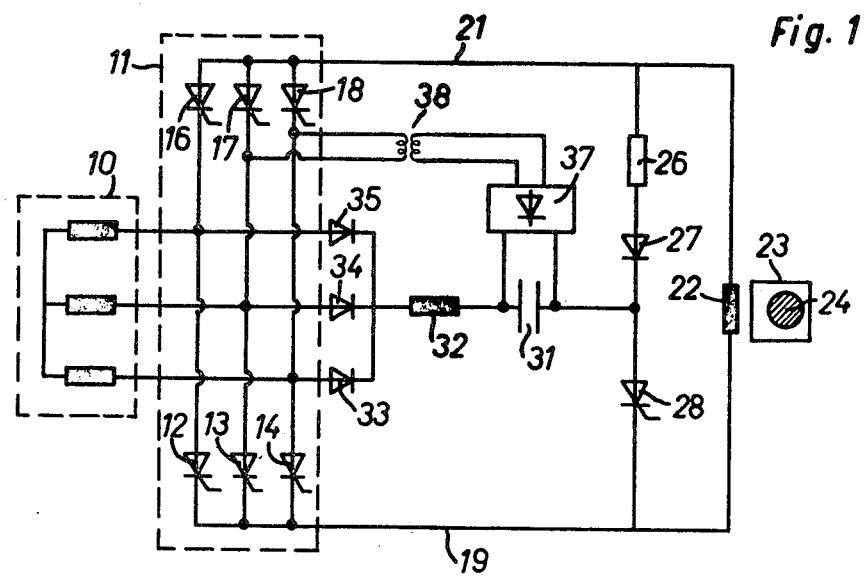
FIG. 1 shows the fundamental diagram of a first form of embodiment of the electronic circuit layout, connected with a current rectifier and wherein the rectifier elements are used as switching thyristors.

FIG. 1 schematically shows the secondary windings 10 of a three-phase transformer, connected in a known manner with a rectifier bridge 11. Each side of said bridge contains three thyristors 12, 13, 14 and respectively 16, 17, 18, the outlets whereof are connected with a busbar 19 and 21, respectively. The busbars lead to an inductor 22, cooperating with a magnetizable yoke 23, which in turn surrounds a channel 24, provided for the guidance of the plasma of a nuclear fusion installation.

A discharge circuit is connected parallel to the inductor, one branch of which contains the series circuit of a deenergizing resistance 26 and a a decoupling or recovery diode 27 and the other branch a controlled quenching thyristor 28.

The quenching circuit of the circuit layout contains a quenching capacitor 31, one terminal of which is connected with the discharge circuit and the other terminal through a quenching coil 32 and three decoupling diodes 33, 34, 35 with a phase each of the secondary winding of the three-phase transformer. The two terminals of the quenching capacitor are further connected with the outlet of a charging rectifier 37, which through a supply transformer 38 is connected to two of the three phases of the secondary winding of the transformer.

In the realization of the process with the above described electronic circuit layout, the thyristors 12, 13, 14 and 16, 17, 18 in the two sides of the rectifier bridge are actuated so that a direct current is flowing in the busbars 19, 21, leading to the generation of a strong magnetic field of the inductor 22. During this period of time, the quenching thyristor 28 is blocked and prevents the flow of current through the deenergizing circuit. The quenching capacitor is charged to a voltage that is somewhat higher than the peak value of the voltage connected through the bridge thyristors 12, 13, 14 with the busbar 19. When the inductor is charged and a high capacity pulse is to be generated, an actuating signal is passed to the quenching thyristor 28 and the actuating signals to the thyristors in the rectifier bridge are interrupted. The quenching capacitor then discharges by way of the busbar 19 through the current conducting thyristor or thyristors 12, 13 and/or 14, the corresponding decoupling diodes 33, 34 and/or 35 and through the quenching coil 32. As soon as in this process the discharge current of the capacitor in one of the thyristors of the rectifier bridge is equal to the opposing storage current for the inductor, the conduction of current through the thyristor is interrupted. Following the interruption of the conduction of current in the thyristors 12, 13, 14 of one side of the bridge, the quenching capacitor discharges further through the inductor 22, the busbar 21 and the thyristor or thyristors 16, 17 and/or 18, which are current carrying at this point in time, and the corresponding decoupling diodes 33, 34 and 35, respectively and the quenching coil 32, until the effective potential has been reduced to the conducting state voltage of the thyristor or thyristors and decoupling diodes. With the onset of the commutation of the charge current to the high ohmic deenergizing circuit, the change in current caused by it collapses the magnetic field. The pulse produced in the process is conducted by the yoke 23 into the ionized gas in channel 24, acting as the secondary part of the transformer, and produces therein a flow of plasma. Part of the energy taken from the inductive storage device is converted into heat in the resistance 26.

Figure 2:
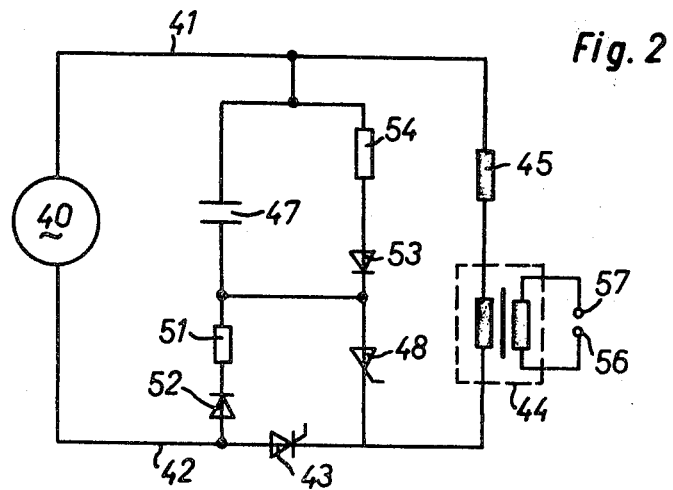
FIG. 2 shows the fundamental circuit diagram of a second form of embodiment of the electronic circuit layout, connected to a high-current generator and containing a switching thyristor

The form of embodiment shown in FIG. 2 of the electronic circuit layout contains a direct current generator 40, connected directly with a first busbar 41 and with a second busbar 42 through a switching thyristor 43 and a pulse transformer 44 and a storage inductor 45. A quenching circuit is connected parallel to the direct current generator and the switching thyristor, containing a quenching capacitor 47 and a quenching thyristor 48 connected in series. The quenching capacitor is connected directly with the first busbar 41 and through a charge diode 52 and a charge resistance 51 with the second busbar 42. The discharge circuit contains the series circuit of recovery diode 53 and a deenergizing resistance 54, which are connected through the quenching thyristor 48 in parallel to the series circuit of the storage inductor and pulse transformer.

The secondary part of the pulse transformer 44 is connected with two electrodes 56, 57, provided for the generation of shock waves in the medium located between the electrodes.

During the generation of a high capacity pulse with the circuit layout according to FIG. 2, a gating signal is passed to the switching thyristor 43. The current appearing in the load circuit of the generator is generating a magnetic field in the storage inductor 45 and the quenching capacitor 47 is being charged simultaneously through the diode 52 and the resistance 51. To produce a high capacity pulse, an actuating signal is then passed to the quenching thyristor 48 and the gating signal for the switching thyristor 43 simultaneously interrupted. The quenching capacitor is then discharged through the quenching thyristor, the switching thyristor and the generator, wherein the quenching current is opposing the charge current, with the switching thyristor passing into the nonconducting state, as soon as the two currents are cancelling each other. Following the interruption of the current by the switching thyrostor 43, the quenching capacitor is further discharged through the pulse transformer and the storage inductor.

With the onset of the commutation of the charge current to the deenergizing circuit 54, 53, 48, a steep change in the current in the inductors 44 and 45 takes place. In the process, a high energy pulse is produced in the secondary part of the transformer, whih may be utilized on the electrodes 56, 57.

FIG. 3 shows the calculated variation of the current with time in the primary circuit of the storage inductor and in the switching thyristor and the quenching capacitor of a circuit layout according to FIG. 2. In simulation of the installation used in a Tokamak nuclear fusion installation to produce the toroidal current, the calculation was based on an inductance of the storage of approximately 5 to 50 mH and on the assumption that the storage current rises to a maximum value of 50 to 100 kA. The peak in the plasma should amount to approximately 1 to 5 MA, corresponding to a current transfer ratio of 1:20 to 1:100.

In case of a suitable selection of a source of current, the storage current rises in the primary circuit in keeping with the part 60 of the curve and attains after a period of time $\Delta t_1 = 3$ to 8 s its maximum value of approximately 100 kA. When at the time $\tau_1$ the quenching thyristor is ignited, the commutation of the storage current from the switching thyristor to the quenching circuit commences. In the process, the current through the switching thyristor declines according to the part 61 of the curve and attains after a period of time $\Delta t_2 = 200$ to 500 s or at the time $\tau_2$, respectively, the value of zero. Simultaneously, the current fed by the quenching thyristor into the primary circuit according the part 62 of the curve, until at the time $\tau_2$ it practically equals the preceding storage current from the source of current. While during the commutation the current supplied by the quenching capacitor rises in a manner similar to the decline of the current through the switching thyristor, the storage current varies during the period of time $\Delta t_2$ in keeping with the law governing the part 60 of the curve, as indicated by the part 63 of the curve. At the time $\tau_2$, the entire storage current flows through the quenching capacitor and the switching thyristor is practically without current. The hold-off interval for the switching thyristor then begins; it amounts to approximately 200 to 500 $\mu$s. During this period of time, the polarity of the quenching capacitor is reversed and commencing at the time $\tau_3$, the current is commutated from the quenching capacitor to the deenergizing circuit and declines in keeping with part 64 of the curve, until after approximately 200 to 400 $\mu$s it has decreased at the time $\tau_4$ to zero. Simultaneously, the storage current is also commutated onto the deenergizing circuit and declines during the period of time $\Delta t_3$, amounting in the example calculated to 1 to 3 s, to zero in keeping with the part 65 of the curve.

As it is immediately evident to any person skilled in the art, the induction storage device may be charged gradually during a finite period of time by means of the aforedescribed electronic circuits. Furthermore, the progress with time of the discharge of the inductive storage device and thus the shape of the high energy pulse may be affected by the choice of the discharge resistance 26 and 54, respectively. It is possible therein to use in place of the one quenching thyristor and switching thyristor shown, several thyristors connected in parallel and actuated in synchronization. It should be understood further that in a realization of the process according to the invention, electronic circuit layouts other than those shown in the fundamental circuit diagram may be employed. In particular, in the circuit according to FIG. 2, in place of the switching and quenching thyristors 43 and 48, in the point connecting the quenching and deenergizing circuit with the busbar 42, a mechanical alternating switch may be used.

We claim:

1. A circuit for generating high-voltage pulses, comprising:
   an inductive storage unit;
   a power source;
   at least one thyristor for selectively connecting said power source to said inductive storage unit;
   a quenching circuit connected to said inductive storage unit, said quenching circuit having a first branch containing a quenching capacitor;
   a discharge circuit connected in parallel with said inductive storage unit, said discharge circuit having a first branch containing a resistor and a unidirectional element connected in series, said first branch of said discharge circuit having a common junction with said first branch of said quenching circuit; and
   a quenching thyristor connected to said common junction so as to be in series with each of said quenching capacitor and said resistor and thereby form a second branch of each of said quenching and discharge circuits.

2. The pulse generating circuit of claim 1 wherein said at least one thyristor is a component of a rectifier bridge.

3. The pulse generating circuit of claim 1 wherein said at least one thyristor is a switching transistor in a power bus connecting said power source to said inductive storage unit.

* * * * *